United States Patent
Strenz et al.

(10) Patent No.: US 8,410,815 B2
(45) Date of Patent: Apr. 2, 2013

(54) TRANSISTOR ARRANGEMENT AND INTEGRATED CIRCUIT

(75) Inventors: Robert Strenz, Radebeul (DE); Klaus Knobloch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/958,428

(22) Filed: Dec. 2, 2010

(65) Prior Publication Data

US 2012/0139581 A1 Jun. 7, 2012

(51) Int. Cl.
*H03K 19/094* (2006.01)
(52) U.S. Cl. .............................................. 326/41; 326/44
(58) Field of Classification Search .................. None
See application file for complete search history.

(56) References Cited

U.S. PATENT DOCUMENTS

| | | | |
|---|---|---|---|
| 5,764,096 A | 6/1998 | Lipp et al. | |
| 5,838,040 A | 11/1998 | Salter et al. | |
| 5,912,488 A * | 6/1999 | Kim et al. | 257/316 |
| 6,005,806 A | 12/1999 | Madurawe et al. | |
| 6,072,720 A | 6/2000 | Peng et al. | |
| 6,125,059 A * | 9/2000 | Hecht | 365/185.29 |
| 6,144,580 A | 11/2000 | Murray | |
| 6,252,273 B1 * | 6/2001 | Salter et al. | 257/316 |
| 7,538,379 B1 | 5/2009 | Dhaoui et al. | |
| 7,611,941 B1 | 11/2009 | Shum et al. | |
| 7,692,972 B1 | 4/2010 | Sadd et al. | |
| 7,816,947 B1 | 10/2010 | Wang | |
| 2009/0059678 A1 | 3/2009 | Strenz et al. | |
| 2010/0149873 A1 | 6/2010 | Wang et al. | |

FOREIGN PATENT DOCUMENTS

| | | |
|---|---|---|
| DE | 19813653 A1 | 10/1998 |
| DE | 19958144 A1 | 7/2000 |
| DE | 102009021744 A1 | 12/2009 |

* cited by examiner

*Primary Examiner* — Crystal L Hammond

(57) ABSTRACT

A transistor arrangement includes a switch transistor and a sense transistor. The switch transistor includes a charge storing structure and a control structure. The sense transistor includes a charge storing structure, a control structure and a select structure. The charge storing structure of the switch transistor is electrically connected to the charge storing structure of the sense transistor. The sense transistor is configured such that the select structure and the control structure of the sense transistor may be electrically controlled independently from one another.

24 Claims, 4 Drawing Sheets

US 8,410,815 B2

TRANSISTOR ARRANGEMENT AND INTEGRATED CIRCUIT

TECHNICAL FIELD

Embodiments generally relate to a transistor arrangement and an integrated circuit.

BACKGROUND

Field programmable gate arrays (FPGA) may be used to realize logic circuits. A FPGA may include an array of logic elements and wiring interconnections with a plurality or multiplicity (e.g. thousands or even tens of thousands) of programmable interconnects so that the FPGA may be configured (for example, by a user) into an integrated circuit with defined logic functions. Each programmable interconnect, or switch, may for example connect two circuit nodes in the integrated circuit to make (or break) a wiring interconnection or to set the function or functions of a logic element.

FPGAs may be realized by non-volatile memory (NVM) based FPGA cells. Each FPGA cell may include a transistor arrangement including a switch transistor (switch device) and a sense transistor (sense device). The sense transistor may be used to program or erase the cell while the switch transistor may be used to read the programmed state of the cell.

BRIEF DESCRIPTION OF THE DRAWINGS

In the drawings, like reference characters generally refer to the same parts throughout the different views. The drawings are not necessarily to scale, emphasis instead generally being placed upon illustrating the principles of embodiments. In the following description, various embodiments are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The term "layer" or "layer structure" as used herein may be understood to refer to a single layer, or to a layer sequence (also referred to as layer stack) including a plurality of sublayers. In a layer sequence or layer stack the individual sublayers may, for example, include or may be made of different materials, or at least one of the sublayers may include or may be made of the same material as another one of the sublayers.

The terms "disposed on", "arranged on" or "formed on" as used herein may be understood to refer to a layer (or some other element or entity) that may be located in direct mechanical and/or electrical contact on another layer (element or entity). A layer (element or entity) may also be located in indirect (mechanical and/or electrical) contact with another layer (element or entity), in this case one or more additional layers (elements or entities) may be present in-between.

The terms "disposed over", "arranged over" or "formed over" as used herein may be understood to refer to a layer (or some other element or entity) that may be located at least indirectly on another layer (element or entity). That is, one or more other layers (elements or entities) may be located between the given layers (elements or entities).

The terms "electrically connected", "electrically contacted" or "electrically coupled" may be understood to include both a direct electrical connection, contact or coupling and an indirect electrical connection, contact or coupling.

Figure 1:
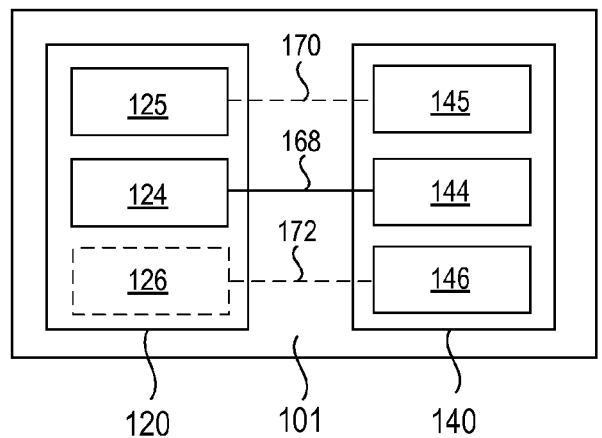
FIG. 1 shows a schematic diagram of a transistor arrangement in accordance with an embodiment.

FIG. 1 shows a schematic view of a transistor arrangement 100 in accordance with an embodiment.

The transistor arrangement 100 may include a switch transistor 120 and a sense transistor 140. The switch transistor 120 may include a charge storing structure 124 and a control structure 125. The sense transistor 140 may include a charge storing structure 144, a control structure 145 and a select structure 146. The charge storing structure 124 of the switch transistor 120 may be electrically connected to the charge storing structure 144 of the sense transistor 140, as is indicated by a connection line 168 in FIG. 1. For example, in accordance with an embodiment, the charge storing structure 124 of the switch transistor 120 and the charge storing structure 144 of the sense transistor 140 may be part of a common charge storing structure, e.g. part of a common floating gate in accordance with an embodiment (not shown, see e.g. FIG. 3A). Alternatively, the connection line 168 may represent suitable wiring electrically connecting the charge storing structures 124, 144 with one another.

The sense transistor 140 may be configured such that the select structure 146 and the control structure 145 of the sense transistor 140 may be electrically controlled independently from one another. In other words, an electrical potential of the select structure 146 may be set or changed independently from an electrical potential of the control structure 145, and vice versa. Thus, the select structure 146 may, for example, be brought to an electrical potential that may be different from an electrical potential of the control structure 145, and vice versa.

Figure 3A:
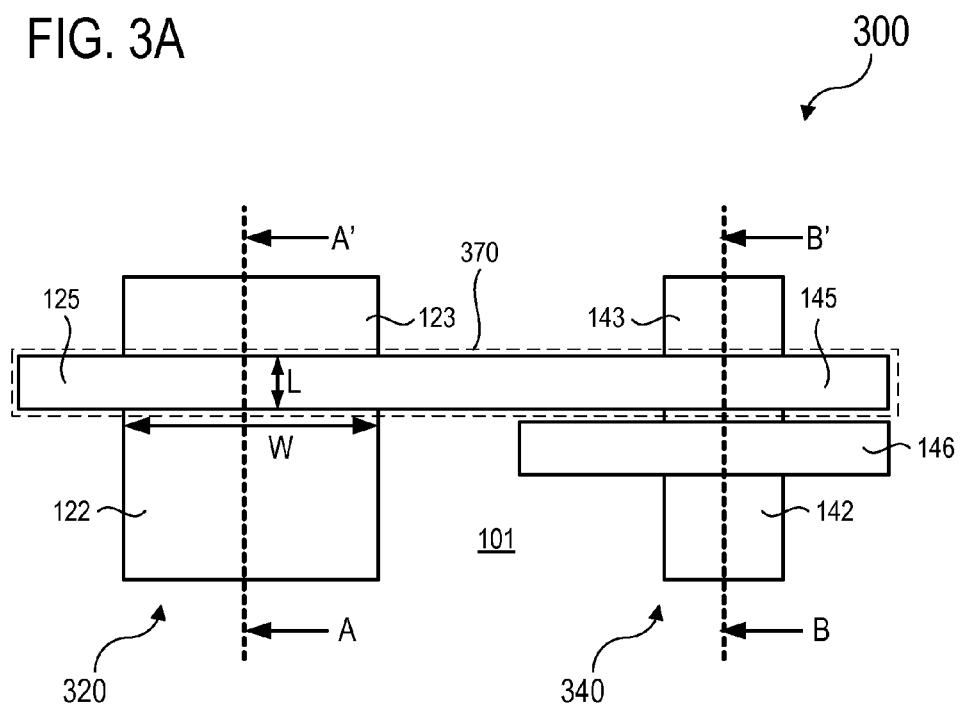
FIG. 3A shows a schematic top-down view of a transistor arrangement in accordance with another embodiment.
Figure 3B:
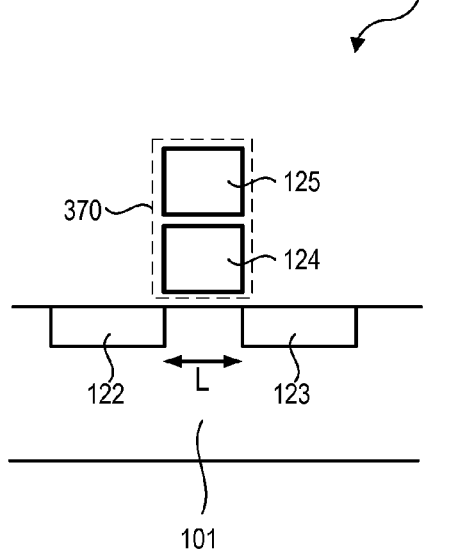
FIGS. 3B and 3C show schematic cross-sectional views of the transistor arrangement of FIG. 3A.

In accordance with an embodiment, the switch transistor 120 may be configured as a 1-transistor device (also referred to as 1T device) (not shown, see e.g. FIG. 3B). For example, the switch transistor 120 may be free from a select structure.

In accordance with some embodiments, the control structure 125 of the switch transistor 120 may be electrically connected to the control structure 145 of the sense transistor 140, as is indicated by a dashed connection line 170 in FIG. 1. For example, in accordance with an embodiment, the control structure 125 of the switch transistor 120 and the control structure 145 of the sense transistor 140 may be part of a common control structure, e.g. part of a common floating gate in accordance with one embodiment (not shown, see e.g. FIG. 3A). Alternatively, the dashed connection line 170 may represent suitable wiring electrically connecting the control structures 125, 145 with one another.

Figure 3C:
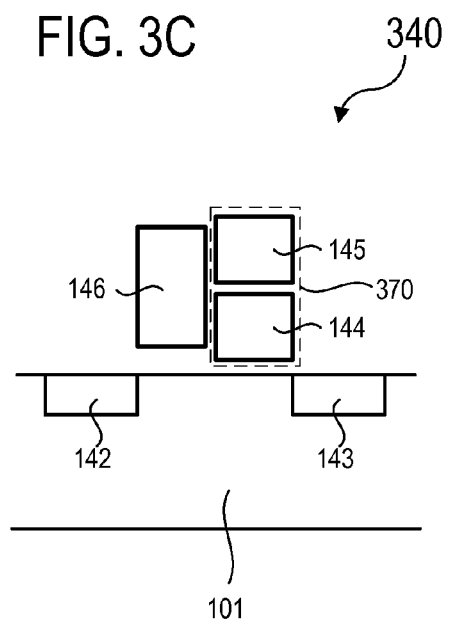

In accordance with an embodiment, the charge storing structure 124 of the switch transistor 120 and the charge storing structure 144 of the sense transistor 140 may each include or be configured as a floating gate (not shown, see e.g. FIGS. 3B and 3C). In accordance with an embodiment, the control structure 125 of the switch transistor 120 and the control structure 145 of the sense transistor 140 may each include or be configured as a control gate (not shown, see e.g. FIGS. 3B and 3C). In accordance with an embodiment, the select structure 146 of the sense transistor 140 may include or be configured as a select gate (not shown, see e.g. FIG. 3C).

In accordance with an embodiment, the charge storing structure (e.g. floating gate) 124 of the switch transistor 120 and the charge storing structure (e.g. floating gate) 144 of the sense transistor 140 may be part of a common charge storing structure (e.g. common floating gate). In other words, the switch transistor 120 and the sense transistor 140 may share a common charge storing structure (e.g. common floating gate) (not shown, see e.g. FIG. 3A).

The charge storing structures (e.g. floating gates) 124, 144 or the common charge storing structure (e.g. common floating gate) may include or may be made of electrically conductive material. In accordance with an embodiment, at least one of the charge storing structures (e.g. floating gates) 124, 144 or the common charge storing structure (e.g. common floating gate) may include or may be made of polysilicon.

In accordance with an embodiment, the control structure (e.g. control gate) 125 of the switch transistor 120 and the control structure (e.g. control gate) 145 of the sense transistor 140 may be part of a common control structure (e.g. common control gate). In other words, the switch transistor 120 and the sense transistor 140 may share a common control structure (e.g. common control gate) (not shown, see e.g. FIG. 3A).

The control structures (e.g. control gates) 125, 145 or the common control structure (e.g. common control gate) may include or may be made of electrically conductive material. In accordance with an embodiment, at least one of the control structures (e.g. control gates) 125, 145 or the common control structure (e.g. common control gate) may include or may be made of polysilicon.

In accordance with some embodiments, the sense transistor 140 may be configured as a 2-transistor device (also referred to as 2T device) (not shown, see e.g. FIG. 3C).

In accordance with an embodiment, the sense transistor 140 may be configured as a split-gate device (not shown, see e.g. FIG. 3C).

In accordance with an embodiment, the charge storing structure (e.g. floating gate) 144 and the control structure (e.g. control gate) 145 of the sense transistor 140 may be stacked. In other words, the charge storing structure (e.g. floating gate) 144 and the control structure (e.g. control gate) 145 of the sense transistor 140 may form a stack (e.g. gate stack) (not shown, see e.g. FIG. 3C).

In accordance with an embodiment, the charge storing structure (e.g. floating gate) 124 and the control structure (e.g. control gate) 125 of the switch transistor 120 may be stacked. In other words, the charge storing structure (e.g. floating gate) 124 and the control structure (e.g. control gate) 125 of the switch transistor 120 may form a stack (e.g. gate stack) (not shown, see e.g. FIG. 3B).

In accordance with an embodiment, the common charge storing structure (e.g. common floating gate) and the common control structure (e.g. common control gate) may be stacked. In other words, the common charge storing structure (e.g. common floating gate) and the common control structure (e.g. common control gate) may form a stack (e.g. gate stack) (not shown, see e.g. FIG. 3A).

In accordance with an embodiment, the select structure (e.g. select gate) 146 of the sense transistor 140 may be configured as a spacer disposed over a sidewall of the charge storing structure (e.g. floating gate) 144 and/or control structure (e.g. control gate) 145 of the sense transistor 140. In other words, according to this embodiment, the select structure (e.g. select gate) 146 may be formed using a spacer technology.

The select structure (e.g. select gate) 146 may include or may be made of electrically conductive material. In accordance with an embodiment, the select structure (e.g. select gate) 146 may include or may be made of polysilicon.

In accordance with an embodiment, the sense transistor 140 may be configured to program and/or erase the charge storing structures (e.g. floating gates) 124, 144 of the switch transistor 120 and the sense transistor 140. For example, in one embodiment, the sense transistor 140 may be configured to program and/or erase the common charge storing structure (e.g. common floating gate). Programming and/or erasing may be achieved by applying suitable electrical potentials to the sense transistor 140 such that program or erase currents may flow through the sense transistor 140 and charge or discharge the charge storing structures 124, 144.

In accordance with an embodiment, the sense transistor 140 may be configured to program the charge storing structures (e.g. floating gates) 124, 144 or the common charge storing structure (e.g. common floating gate) using a source side injection (SSI) mechanism.

In accordance with another embodiment, the sense transistor 140 may be configured to program the charge storing structures (e.g. floating gates) 124, 144 or the common charge storing structure (e.g. common floating gate) using a Fowler-Nordheim (FN) tunneling mechanism.

In accordance with an embodiment, the sense transistor 140 may be configured to erase the charge storing structures (e.g. floating gates) 124, 144 or the common charge storing structure (e.g. common floating gate) using a Fowler-Nordheim (FN) tunneling mechanism.

In accordance with an embodiment, the switch transistor 120 may be configured to read the programmed state of the charge storing structures (e.g. floating gates) 124, 144 or of the common charge storing structure (e.g. common floating gate). Reading may be achieved by applying suitable electrical potentials to the switch transistor 120 such that a read current may flow through the switch transistor 120. The magnitude of the read current may indicate the programmed state.

In accordance with an embodiment, the switch transistor 120 may optionally include a select structure 126, as shown in dashed lines. In accordance with an embodiment, the select structure 126 may be electrically connected to the select structure 146 of the sense transistor 140, as is indicated by a dashed connection line 172 in FIG. 1. For example, in accordance with an embodiment, the select structure 126 of the switch transistor 120 and the select structure 146 of the sense transistor 140 may be part of a common select structure, e.g. part of a common select gate in accordance with one embodiment (not shown, see e.g. FIG. 5A). Alternatively, the dashed connection line 172 may represent suitable wiring electrically connecting the select structures 126, 146 with one another.

In accordance with an embodiment, the select structure 126 and the control structure 125 of the switch transistor 120 may be electrically controlled independently from one another. In other words, an electrical potential of the select structure 126 may be set or changed independently from an electrical potential of the control structure 125, and vice versa. Thus, the select structure 126 may, for example, be brought to an electrical potential that may be different from an electrical potential of the control structure 125, and vice versa.

In accordance with an embodiment, the switch transistor 120 may be configured as a 2-transistor device (2T device).

In accordance with an embodiment, the switch transistor 120 may be configured as a split-gate device.

In accordance with an embodiment, the select structure 126 of the switch transistor 120 may be configured as a select gate. In accordance with an embodiment, the select gate of the switch transistor 120 may be configured as a spacer disposed over a sidewall of the charge storing structure (e.g. floating gate) 124 and/or control structure (e.g. control gate) 125 of the switch transistor 120.

In accordance with some embodiments, the transistor arrangement 100 may further include a substrate 101 (e.g. a semiconductor substrate such as, for example, a silicon substrate), and the switch transistor 120 and/or the sense transistor 140 may be disposed in or above (e.g. over) the substrate 101, as shown in FIG. 1.

In accordance with an embodiment, the transistor arrangement 100 may be configured as or may be used in a programmable interconnect.

In accordance with an embodiment, the transistor arrangement 100 may be configured as or may be used in a programmable logic device (PLD).

In accordance with an embodiment, the transistor arrangement 100 may be configured as or may be used in a field programmable gate array (FPGA) cell.

A plurality of FPGA cells may, for example, be coupled to form an integrated circuit that may, for example, be configured as a logic circuit to realize one more logic functions.

Figure 2:
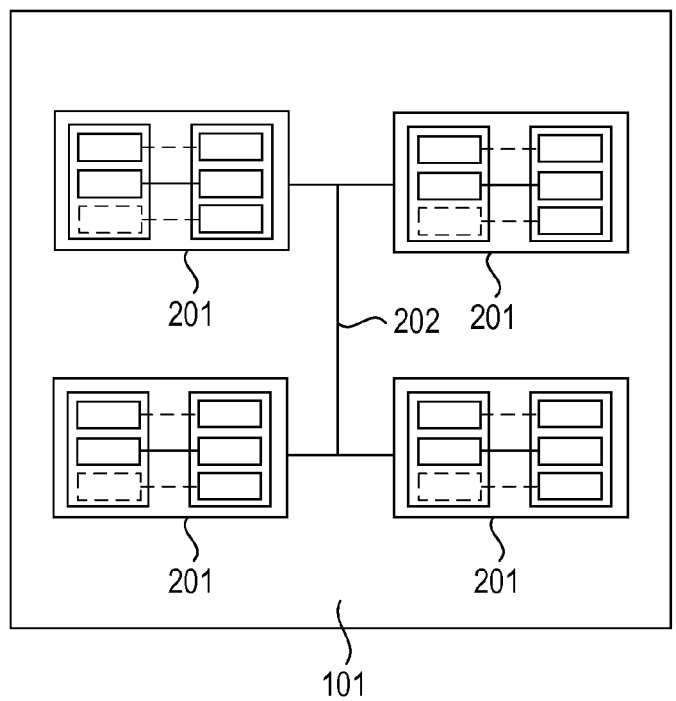
FIG. 2 shows a schematic diagram of an integrated circuit in accordance with another embodiment.

FIG. 2 shows a schematic diagram of an integrated circuit 200 in accordance with another embodiment.

The integrated circuit 200 may include a plurality of field programmable gate array (FPGA) cells 201. In FIG. 2, four cells 201 are shown as an example, in general the integrated circuit 200 may include an arbitrary number of cells 201. Each of the FPGA cells 201 may include or may consist of a transistor arrangement in accordance with one of the embodiments described herein. For example, each of the FPGA cells 201 may include a transistor arrangement 100 as described above in connection with FIG. 1 (alternatively, a transistor arrangement in accordance with one or more other embodiments described herein). At least some of the cells 201 may be electrically connected with one another, as is symbolized by a connection 202 in FIG. 2. The connections between individual cells 201 may, for example, be achieved by means of suitable wiring (e.g. one or more conductive lines). In accordance with some embodiments, the cells 201 may be formed in or above (e.g. over) a substrate 101, as shown.

In accordance with an embodiment, the integrated circuit 200 may be configured as a programmable logic circuit. The logic circuit may, for example, provide or realize one or more logic functions.

In accordance with an embodiment, the integrated circuit 200 may be configured as a field programmable gate array (FPGA).

FIG. 3A shows a schematic top-down layout view of a transistor arrangement 300 in accordance with another embodiment. The transistor arrangement 300 includes a switch transistor 320 and a sense transistor 340 disposed next to the switch transistor 320. FIG. 3B is a schematic cross-sectional view of the transistor arrangement 300 along line A-A' in FIG. 3A, and FIG. 3C is a schematic cross-sectional view of the transistor arrangement 300 along line B-B' in FIG. 3A. Illustratively, FIG. 3B is a cross-sectional view of the switch transistor 320 of the transistor arrangement 300 while FIG. 3C is a cross-sectional view of the sense transistor 340 of the transistor arrangement 300.

In accordance with some embodiments, the transistor arrangement 300 may be formed in and/or above a substrate 101 (as shown), for example a semiconductor substrate such as e.g. a silicon substrate (alternatively, other semiconductor materials may be used). In accordance with one embodiment, the substrate 101 may be configured as a p-type substrate. In accordance with another embodiment, the substrate 101 may be configured as an n-type substrate. In accordance with other embodiments, the transistor arrangement 300 may be formed in and/or above one or more doped well regions (not shown) that may be formed in the substrate 101.

The switch transistor 320 includes a charge storing structure 124 disposed over the substrate 101, and a control structure 125 disposed over the charge storing structure 124. In accordance with the embodiment shown, the charge storing structure 124 of the switch transistor 320 is configured as a floating gate and the control structure 125 of the switch transistor 320 is configured as a control gate. In accordance with the embodiment shown, the floating gate 124 and the control gate 125 of the switch transistor 320 are made of polysilicon. According to other embodiments, the floating gate 124 and/or control gate 125 of the switch transistor 320 may include or may be made of other electrically conductive materials. In accordance with some embodiments, the floating gate 124 and control gate 125 of the switch transistor 320 may be electrically insulated from one another and/or from the substrate 101, for example by means of one or more electrically insulating (dielectric) layers disposed in-between (not shown).

The sense transistor 340 includes a charge storing structure 144 disposed over the substrate 101, and a control structure 145 disposed over the charge storing structure 144. In accordance with the embodiment shown, the charge storing structure 144 of the sense transistor 340 is configured as a floating gate and the control structure 145 of the sense transistor 340 is configured as a control gate. In accordance with the embodiment shown, the floating gate 144 and the control gate 145 of the sense transistor 340 are made of polysilicon. According to other embodiments, the floating gate 144 and/or control gate 145 of the sense transistor 340 may include or may be made of other electrically conductive materials. In accordance with some embodiments, the floating gate 144 and control gate 145 of the sense transistor 340 may be electrically insulated from one another and/or from the substrate 101, for example by means of one or more electrically insulating (dielectric) layers disposed in-between (not shown).

The sense transistor 340 further includes a select structure 146. In accordance with the embodiment shown, the select structure 146 of the sense transistor 340 is configured as a select gate. The select gate 146 may be configured as a spacer and may be disposed over a sidewall of the floating gate 144 and the control gate 145 of the sense transistor 340, as shown. The select gate 146 may be electrically insulated from the floating gate 144, the control gate 145 and the substrate 101, for example by means of one or more electrically insulating (dielectric) layers disposed in-between (not shown).

The charge storing structure 124 of the switch transistor 320 is electrically connected to the charge storing structure 144 of the sense transistor 340. In accordance with the embodiment shown, the charge storing structure 124 (i.e. the floating gate 124 according to this embodiment) of the switch transistor 320 and the charge storing structure 144 (i.e. the floating gate 144 according to this embodiment) of the sense transistor 340 are part of a common floating gate. The common floating gate is part of a gate stack 370 including the common floating gate and a common control gate (in the layout view of FIG. 3A, the common floating gate is covered by the common control gate). Illustratively, the floating gate 124 of the switch transistor 320 constitutes a first portion of the common floating gate and the floating gate 144 of the sense transistor 340 constitutes a second portion of the common floating gate. As the floating gates 124, 144 of the switch transistor 320 and the sense transistor 340 are part of one common floating gate, they will have the same electrical potential and may be charged or discharged (programmed or erased) simultaneously.

Furthermore, in accordance with the embodiment shown, the control structure 125 (i.e. the control gate 125 according to this embodiment) of the switch transistor 320 and the control structure 145 (i.e. the control gate 145 according to this embodiment) of the sense transistor 340 are part of a common control gate (which is part of the gate stack 370), as is shown in the layout view of FIG. 3A. Illustratively, the control gate 125 of the switch transistor 320 constitutes a first portion of the common control gate and the control gate 145 of the sense transistor 340 constitutes a second portion of the common control gate. As the control gates 125, 145 of the switch transistor 320 and the sense transistor 340 are part of one common control gate, they may be brought to the same electrical potential simultaneously by applying the electrical potential to the common control gate.

Illustratively, the transistor arrangement 300 in accordance with this embodiment includes a floating gate/control gate double poly stack 370, in other words, a gate stack 370 including the common floating gate and common control gate made of polysilicon and spanning the switch transistor 320 and the sense transistor 340.

In accordance with alternative embodiments, the floating gates 124, 144 may be individual gates that may be electrically connected with one another, for example by means of suitable wiring (e.g. one or more conductive lines), and/or the control gates 125, 145 may be individual gates that may be electrically connected with another, for example by means of suitable wiring (e.g. one or more conductive lines).

The sense transistor 340 further includes the select structure 146 (i.e. the select gate according to this embodiment). The sense transistor 340 is configured such that the select structure (select gate) 146 and the control structure (control gate 145) of the sense transistor 340 may be electrically controlled independently from one another. In other words, an electrical potential of the select structure (select gate) 146 may be set or changed independently from an electrical potential of the control structure (control gate) 145, and vice versa. Thus, the select structure (select gate) 146 may, for example, be brought to an electrical potential that may be different from an electrical potential of the control structure (control gate) 145, and vice versa.

The switch transistor 320 may further include source/drain regions 122, 123 that may be formed in the substrate 101, as shown (alternatively, in one or more well regions formed in the substrate 101). The source/drain regions 122, 123 of the switch transistor 320 may include a first source/drain region 122 (e.g. configured as a source region of the switch transistor 320 in accordance with an embodiment) and a second source/drain region 123 (e.g. configured as a drain region of the switch transistor 320 in accordance with an embodiment).

In accordance with some embodiments, the source/drain regions 122, 123 of the switch transistor 320 may be doped, for example highly doped. For example, in accordance with one embodiment, the source/drain regions 122, 123 may be highly n-doped (e.g. n+ doped).

The sense transistor 340 may further include source/drain regions 142, 143 that may be formed in the substrate 101, as shown (alternatively, in one or more well regions formed in the substrate 101). The source/drain regions 142, 143 of the sense transistor 340 may include a first source/drain region 142 (e.g. configured as a source region of the sense transistor 340 in accordance with an embodiment) and a second source/drain region 143 (e.g. configured as a drain region of the sense transistor 340 in accordance with an embodiment).

In accordance with some embodiments, the source/drain regions 142, 143 of the sense transistor 340 may be doped, for example highly doped. For example, in accordance with one embodiment, the source/drain regions 142, 143 may be highly n-doped (e.g. n+ doped).

According to the embodiment shown, the switch transistor 320 is configured as a 1-transistor device including the stacked floating gate 124 and control gate 125. As shown, the switch transistor 320 does not have a select structure, in contrast to the sense transistor 340. The sense transistor 340 illustratively is configured as a 2-transistor device (or split-gate device) including the stacked floating gate 144 and control gate 145 and, in addition, the select gate 146, which may be electrically controlled independently from the control gate 145. In accordance with an embodiment, the select gate 146 may, for example, be configured as a spacer, as shown.

In accordance with some embodiments, the sense transistor 340 may be used to program and/or erase the charge storing structures 124, 144 (i.e. floating gates 124, 144 according to this embodiment) of the switch transistor 320 and the sense transistor 340. In particular, the sense transistor 340 may be used to program and/or erase the common floating gate by charging or discharging the common floating gate, thereby changing the electrical potential of the common floating gate.

Programming of the charge storing structures (i.e. floating gates 124, 144 or common floating gate in accordance with the embodiment shown) may be achieved by applying suitable electrical potentials to at least one of the substrate 101, the first source/drain region 142, the second source/drain region 143, the control gate 145 and the select gate 146 of the sense transistor 340 (using, for example, suitable circuitry that may be coupled to the sense transistor 340). In this connection, the select gate 146 may, for example, be used to use source side injection (SSI) as programming mechanism. In accordance with other embodiments, other programming mechanisms such as, for example, a Fowler-Nordheim tunneling program mechanism, may be used.

Similarly, erasing of the charge storing structure (i.e. floating gates 124, 144 common floating gate in accordance with the embodiment shown) may be achieved by applying suitable electrical potentials to at least one of the substrate 101, the first source/drain region 142, the second source/drain region 143, the control gate 145 and the select gate 146 of the sense transistor 340 (using, for example, suitable circuitry that may be coupled to the sense transistor 340).

In accordance with one embodiment, erasing the charge storing structures 124, 144 (i.e. floating gates) may be achieved using a Fowler-Nordheim tunneling erase mechanism.

In accordance with some embodiments, the transistor arrangement 300 may be configured as or may be used in a field programmable gate array (FPGA) cell.

Illustratively, a FPGA cell based on the transistor arrangement 300 has different device types for switch and sense transistor.

The sense transistor 340, which may be used for program and erase operation of the cell, consists of a 2-transistor split-gate cell structure including floating gate 144, control gate 145 and select gate 146. The select gate 146 may be controlled independently from the control gate 145 and may, for example, be configured as a spacer. The select gate 146 may be used to use source side injection as programming mechanism.

In the switch transistor 320, the select gate is omitted. That is, the switch transistor 320 includes only the floating gate 124 and the control gate 125. This may allow for a higher reading current at the switch for the following reasons: as the select gate is absent in the switch transistor 320, the length L of the transistor channel may be smaller compared to a switch transistor having an additional select gate. Therefore, the W/L ratio (W: transistor width, L: length of transistor channel) of the switch transistor 320 may be larger compared to a switch transistor with additional select gate that has the same width W but a greater length L (due to the select gate). Due to its larger W/L ratio the switch transistor 320 may have a lower electrical series resistance compared to a switch transistor with select gate, and thus the read current in the switch transistor 320 may be higher compared to a switch transistor with select gate. A high switch reading current may be beneficial to obtain high-performance FPGA products.

Figure 4A:
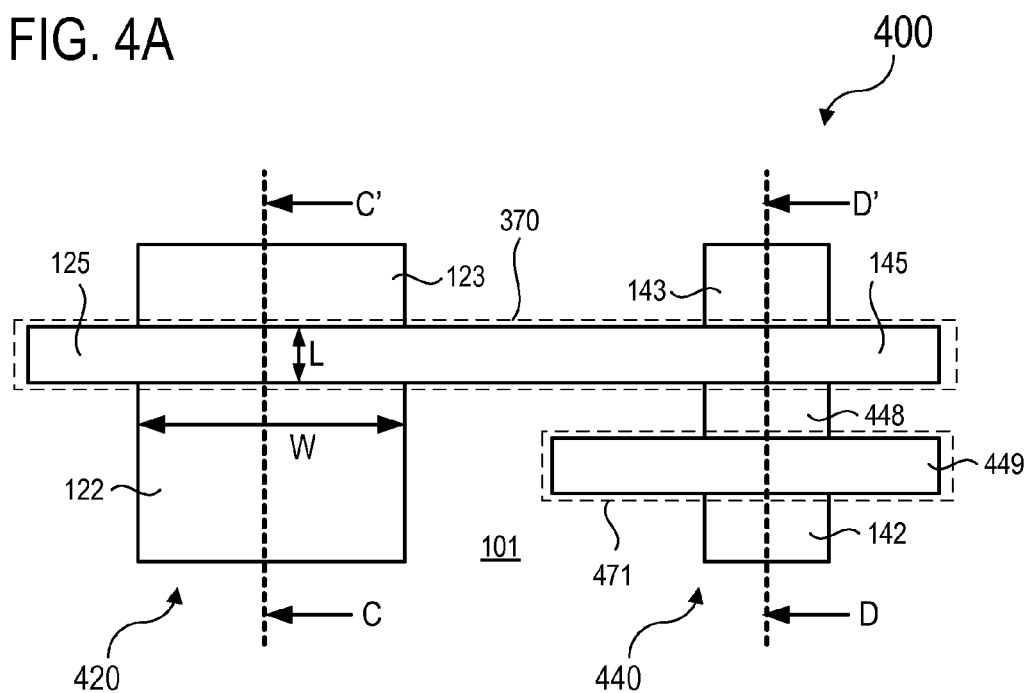
FIG. 4A shows a schematic top-down view of a transistor arrangement in accordance with another embodiment.
Figure 4B:
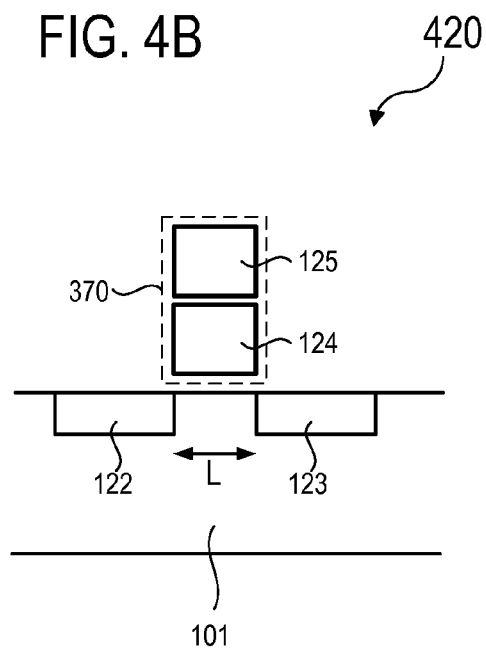
FIGS. 4B and 4C show schematic cross-sectional views of the transistor arrangement of FIG. 4A.
Figure 4C:
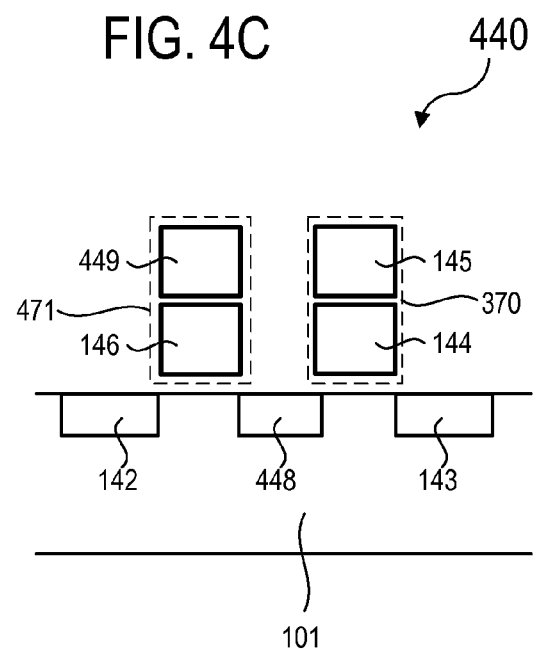

FIG. 4A shows a schematic top-down layout view of a transistor arrangement 400 in accordance with another embodiment. The transistor arrangement 400 includes a switch transistor 420 and a sense transistor 440 disposed next to the switch transistor 420. FIG. 4B is a schematic cross-sectional view of the transistor arrangement 400 along line C-C' in FIG. 4A and FIG. 4C is a schematic cross-sectional view of the transistor arrangement 400 along line D-D' in FIG. 4A. Illustratively, FIG. 4B is a cross-sectional view of the switch transistor 420 of the transistor arrangement 400 while FIG. 4C is a cross-sectional view of the sense transistor 440 of the transistor arrangement 400.

The transistor arrangement 400 is to some extent similar to the transistor arrangement 300 shown in FIGS. 3A to 3C. In particular, elements with the same reference numerals are the same and will not be described in detail again here for the sake of brevity. The transistor arrangement 400 is different from the transistor arrangement 300 shown and described in connection with FIGS. 3A to 3C mainly in that the select gate 146 of the sense transistor 440 is part of a gate stack 471 including the select gate 146, which is disposed over the substrate 101, and an additional gate 449, which is disposed over the select gate 146. The additional gate 449 may include or may be made of an electrically conductive material. In accordance with one embodiment, the additional gate 449 may include or may be made of the same material or materials as the select gate 146, for example polysilicon. In case that both the select gate 146 and the additional gate 449 are made of polysilicon, the gate stack 471 may clearly be configured as a double poly stack.

In accordance with some embodiments, the additional gate 449 and the select gate 146 may be electrically insulated from one another and/or from the substrate 101 by means of one or more electrically insulating (dielectric) layers disposed in-between (not shown).

In accordance with one embodiment, the additional gate 449 (clearly, the upper gate of the gate stack 471) may be left floating while the select gate 146 (clearly, the lower gate of the gate stack 471) may be controlled by applying suitable electrical potentials thereto.

In accordance with another embodiment, the additional gate 449 and the select gate 146 may be electrically connected to one another (not shown). In accordance with still another embodiment, the additional gate 449 may be omitted. In other words, only the select gate 146 may be present in this case (not shown).

The gate stack 471 including the additional gate 449 and the select gate 146 is laterally spaced apart from the gate stack 370 including the floating gate 144 and the control gate 145 of the sense transistor 440. The sense transistor 440 further includes a drift region 448, which is located in the substrate 101 and is arranged laterally between the gate stack 471 including the select gate 146 and the gate stack 370 including the floating gate 144 of the sense transistor 440, as shown.

Similarly as in the switch transistor 320 of the transistor arrangement 300 shown in FIGS. 3A to 3C, a select gate is omitted in the switch transistor 420 of the transistor arrangement 400 shown in FIGS. 4A to 4C. Thus, similarly as in the transistor arrangement 300, a W/L ratio of the switch transistor 420 of the transistor arrangement 400 may be higher compared to a switch transistor having a select gate. Therefore, a read current may be increased which may, for example, be beneficial with regard to the possible use of the transistor arrangement 400 in or as a FPGA cell.

Figure 5A:
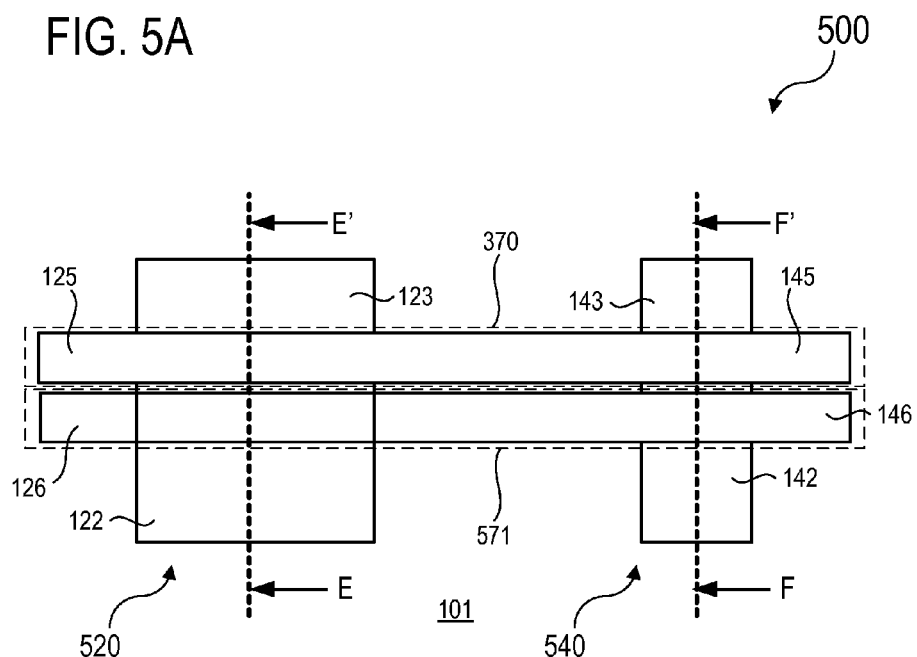
FIG. 5A shows a schematic top-down view of a transistor arrangement in accordance with another embodiment.
Figure 5B:
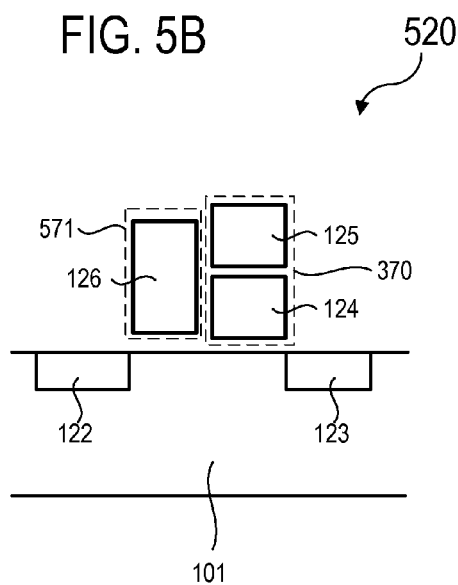
FIGS. 5B and 5C show schematic cross-sectional views of the transistor arrangement of FIG. 5A.
Figure 5C:
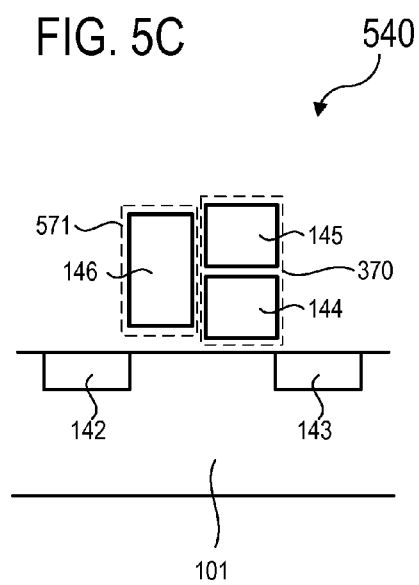

FIG. 5A shows a schematic top-down layout view of a transistor arrangement 500 in accordance with another embodiment. The transistor arrangement 500 includes a switch transistor 520 and a sense transistor 540 disposed next to the switch transistor 520. FIG. 5B is a schematic cross-sectional view of the transistor arrangement 500 along line E-E' in FIG. 5A and FIG. 5C is a schematic cross-sectional view of the transistor arrangement 500 along line F-F' in FIG. 5A. Illustratively, FIG. 5B is a cross-sectional view of the switch transistor 520 of the transistor arrangement 500 while FIG. 5C is a cross-sectional view of the sense transistor 540 of the transistor arrangement 500.

The transistor arrangement 500 is to some extent similar to the transistor arrangement 300 shown in FIGS. 3A to 3C. In particular, elements with the same reference numerals are the same and will not be described in detail again here for the sake of brevity. The transistor arrangement 500 is different from the transistor arrangement 300 shown and described in connection with FIGS. 3A to 3C mainly in that the select transistor 520 also includes a select structure 126. According to the embodiment shown, the select structure 126 of the switch transistor 520 is configured as a select gate. The select gate 126 may be configured as a spacer and may be disposed over a sidewall of the floating gate 124 and the control gate 125 of the switch transistor 520, as shown. The select gate 126 may be electrically insulated from the floating gate 124, the control gate 125 and the substrate 101, for example by means of one or more electrically insulating (dielectric) layers disposed in-between (not shown). Illustratively, the select gate 126 of the switch transistor 520 may be configured in a similar manner as the select 146 of the sense transistor 540. In accordance with one embodiment, the select gate 126 of the switch transistor 520 and the select gate 146 of the sense transistor 540 may be part of a common select gate 571, as shown in FIGS. 5A to 5C. Illustratively, the select gate 126 of the switch transistor 520 may constitute a first portion of the common select gate 571 and the select gate 146 of the sense transistor 540 may constitute a second portion of the common select gate 571, as shown. Alternatively, the select gates 126, 146 may be individual gates that may be electrically connected to one another, for example by means of suitable wiring (e.g. one or more conductive lines).

Illustratively, the switch transistor 520 and the sense transistor 540 of the transistor arrangement 500 are both configured as a 2-transistor device including a floating gate 124, 144, a control gate 125, 145 and a select gate 126, 146. In accordance with one embodiment, the switch transistor 520 and the sense transistor 540 may both be configured as a split-gate device with a spacer select gate.

A transistor arrangement in accordance with an embodiment may include a switch transistor including a charge storing structure and a control structure; and a sense transistor including a charge storing structure, a control structure and a select structure. The charge storing structure of the switch transistor may be electrically connected to the charge storing structure of the sense transistor. The sense transistor may be configured such that the select structure and the control structure of the sense transistor may be electrically controlled independently from one another.

In accordance with an embodiment, the switch transistor may be free from a select structure. Illustratively, the switch transistor may be configured as a 1-transistor device.

In accordance with an embodiment, the control structure of the switch transistor may be electrically connected to the control structure of the sense transistor.

In accordance with an embodiment, the charge storing structure of the switch transistor and the charge storing structure of the sense transistor may each include a floating gate, the control structure of the switch transistor and the control structure of the sense transistor may each include a control gate, and the select structure of the sense transistor may include a select gate.

In accordance with an embodiment, at least one of the gates may include or may be made of polysilicon.

In accordance with an embodiment, the floating gate of the switch transistor and the floating gate of the sense transistor may be part of a common floating gate. In other words, the switch transistor and the sense transistor may share a common floating gate.

In accordance with an embodiment, the control gate of the switch transistor and the control gate of the sense transistor may be part of a common control gate. In other words, the switch transistor and the sense transistor may share a common control gate.

In accordance with an embodiment, the common floating gate and/or the common control gate may include or may be made of polysilicon.

In accordance with an embodiment, the sense transistor may be configured as a 2-transistor device.

In accordance with an embodiment, the sense transistor may be configured as a split-gate device.

In accordance with an embodiment, the floating gate and the control gate of the sense transistor may be stacked. In other words, the floating gate and the control gate of the sense transistor may form a gate stack of the sense transistor. In the gate stack, the control gate may be disposed over the floating gate.

In accordance with an embodiment, the floating gate and the control gate of the switch transistor form may be stacked. In other words, the floating gate and the control gate of the switch transistor may form a gate stack of the switch transistor. In the gate stack, the control gate may be disposed over the floating gate.

In accordance with an embodiment, the common floating gate and the common control gate may be stacked. In other words, the common floating gate and the common control gate may form a gate stack, which may span the switch transistor and the sense transistor. In the gate stack, the common control gate may be disposed over the common floating gate.

In accordance with an embodiment, the select gate may be configured as a spacer disposed over a sidewall of the floating gate and/or of the control gate of the sense transistor.

In accordance with an embodiment, the sense transistor may be configured to program and/or erase the charge storing structures (e.g. floating gates) of the switch transistor and the sense transistor. In an embodiment, the sense transistor may be configured to program and/or erase the common floating gate.

In accordance with an embodiment, the sense transistor may be configured to program the charge storing structures (e.g. floating gates) using a source side injection (SSI) mechanism. In an embodiment, the sense transistor may be configured to program the common floating gate using a source side injection mechanism.

In accordance with another embodiment, the sense transistor may be configured to program the charge storing structures (e.g. floating gates) using a Fowler-Nordheim (FN) tunneling mechanism. In an embodiment, the sense transistor may be configured to program the common floating gate using a Fowler-Nordheim (FN) tunneling mechanism.

In accordance with an embodiment, the sense transistor may be configured to erase the charge storing structures (e.g. floating gates) using a Fowler-Nordheim tunneling mechanism. In an embodiment, the sense transistor may be configured to erase the common floating gate using a Fowler-Nordheim tunneling mechanism.

In accordance with an embodiment, the switch transistor may further include a select structure. The select structure and the control structure of the switch transistor may be electrically controlled independently from one another.

In accordance with an embodiment, the switch transistor may be configured as a 2-transistor device.

In accordance with an embodiment, the switch transistor may be configured as a split-gate device.

In accordance with an embodiment, the select structure of the switch transistor may include a select gate. The select gate may be configured as a spacer disposed over a sidewall of the charge storing structure (e.g. floating gate) and/or the control structure (e.g. control gate) of the switch transistor.

In accordance with an embodiment, the transistor arrangement may include a substrate (e.g. a semiconductor substrate such as, for example, a silicon substrate), and the switch transistor and the sense transistor may be disposed in and/or above (e.g. over) the substrate.

In accordance with an embodiment, the transistor arrangement may be configured as or may be used in a programmable interconnect.

In accordance with an embodiment, the transistor arrangement may be configured as or may be used in a programmable logic device (PLD).

In accordance with an embodiment, the transistor arrangement may be configured as or may be used in a field programmable gate array (FPGA) cell.

A transistor arrangement in accordance with another embodiment may include: a 1-transistor type switch device including a floating gate and a control gate; and a 2-transistor type sense device including a floating gate, a control gate and a select gate. The floating gate of the switch device may be electrically connected to the floating gate of the sense device. The sense device may be configured such that the select gate and the control gate of the sense device may be controlled independently from one another.

In accordance with an embodiment, the switch device and the sense device may be configured in accordance with a split-gate cell technology.

In accordance with an embodiment, the switch device and the sense device may be configured in accordance with a spacer split-gate cell technology. The select gate of the sense device may be configured as a spacer that may be disposed over a sidewall of the floating gate and/or the control gate of the sense device.

In accordance with an embodiment, at least one of the gates of the switch device and the sense device may include or may be made of polysilicon.

In accordance with an embodiment, the floating gate of the switch device and the floating gate of the sense device may be part of a common floating gate. In other words, a common floating gate may be provided that may, for example, span the switch device and the sense device.

In accordance with an embodiment, the control gate of the switch device and the control gate of the sense device may be part of a common control gate. In other words, a common control gate may be provided that may, for example, span the switch device and the sense device.

In accordance with an embodiment, the common floating gate and the common control gate may be stacked. In other words, the common floating gate and the common control gate may form a gate stack of the transistor arrangement. In the gate stack, the common control gate may be disposed over the common floating gate.

In accordance with an embodiment, the sense device may be configured to program the floating gates of the switch device and the sense device (or the common floating gate) using a source side injection mechanism.

In accordance with an embodiment, the transistor arrangement may be configured as or may be used in a programmable interconnect.

In accordance with an embodiment, the transistor arrangement may be configured as or may be used in a programmable logic device (PLD).

In accordance with an embodiment, the transistor arrangement may be configured as or may be used in a field programmable gate array (FPGA) cell.

An integrated circuit in accordance with an embodiment may include a plurality of field programmable gate array (FPGA) cells in accordance with one of the embodiments described herein. The FPGA cells may be electrically connected with one another.

In accordance with an embodiment, the integrated circuit may be configured as a programmable logic circuit. The logic circuit may, for example, provide or realize one or more logic functions.

In accordance with an embodiment, the integrated circuit may be configured as a field programmable gate array (FPGA).

In the following, certain features, aspects and effects of exemplary embodiments are described.

In accordance with some embodiments, a transistor arrangement includes a switch transistor and a sense transistor. In accordance with some embodiments, the switch transistor and the sense transistor may be formed using the same technology, however, the switch transistor may have a different structure than the sense transistor. In other words, the switch transistor may be a different device type than the sense transistor. For example, in accordance with some embodiments, the switch transistor and the sense transistor may both be formed using a split-gate memory cell technology (for example a split-gate memory cell technology based on a triple-poly-gate memory cell structure (including floating gate/control gate stack and select gate made of polysilicon) and source side injection (SSI) as programming mechanism (also referred to as HS3P ("Hot Source Triple Poly") memory cell technology herein) where, however, in the switch transistor the select gate is omitted. That is, in accordance with some embodiments, the sense transistor may have three gates (floating gate, control gate and select gate) while the switch transistor may have only two gates (floating gate and control gate).

In accordance with some embodiments, a high-performance field programmable gate array (FPGA) bitcell using split-gate non-volatile memory (NVM) cell technology may be provided.

In accordance with some embodiments a FPGA bitcell based on split-gate (e.g. HS3P) embedded Flash technology may be provided and may thereby allow FPGA products to be realized with split-gate (e.g. HS3P) technology.

In accordance with some embodiments, high reading currents of a FPGA switch may be achieved by using different device types as sense and switch devices. In accordance with some embodiments, high reading currents may be achieved by omitting the select gate in the switch transistor. A high reading current of the switch transistor may be a relevant parameter for high-performance FPGA products.

In accordance with some embodiments, two different device types are used for sense and switch transistor. In accordance with some embodiments, the sense transistor, which may be used for program and erase operation, may include or may consist of a split-gate cell structure such as, for example a HS3P cell structure, including control gate, floating gate as well as select gate. The select gate may be used in order to use source side injection as programming mechanism. In accordance with some embodiments, the select gate may be removed or eliminated (in other words, omitted) in the switch transistor. That is, in accordance with some embodiments the switch transistor may only have a floating gate and a control gate (and no select gate). This may allow for a higher reading current at the switch because of a higher W/L ratio (i.e. width-to-length ratio). High switch reading current may be a relevant parameter for high-performance FPGA products.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A transistor arrangement, comprising:
   a switch transistor comprising a charge storing structure and a control structure; and
   a sense transistor comprising a charge storing structure, a control structure and a select structure;
   wherein the control structure of the switch transistor and the control structure of the sense transistor each comprise a control gate;
   wherein the select structure of the sense transistor comprises a select gate;
   wherein the charge storing structure of the switch transistor is electrically connected to the charge storing structure of the sense transistor; and
   wherein the sense transistor is configured such that the select structure and the control structure of the sense transistor may be electrically controlled independently from one another.

2. The transistor arrangement of claim 1,
   wherein the switch transistor is free from a select structure.

3. The transistor arrangement of claim 1,
wherein the control structure of the switch transistor is electrically connected to the control structure of the sense transistor.

4. The transistor arrangement of claim 1,
wherein the charge storing structure of the switch transistor and the charge storing structure of the sense transistor each comprise a floating gate.

5. The transistor arrangement of claim 4,
wherein at least one of the gates comprises polysilicon.

6. The transistor arrangement of claim 4,
wherein the floating gate of the switch transistor and the floating gate of the sense transistor are part of a common floating gate; and
wherein the control gate of the switch transistor and the control gate of the sense transistor are part of a common control gate.

7. The transistor arrangement of claim 6,
wherein at least one of the common floating gate and the common control gate comprises polysilicon.

8. The transistor arrangement of claim 1,
wherein the sense transistor is configured as a split-gate device.

9. The transistor arrangement of claim 4,
wherein the select gate is configured as a spacer disposed over a sidewall of at least one of the floating gate and the control gate of the sense transistor.

10. The transistor arrangement of claim 1,
wherein the sense transistor is configured to program or erase the charge storing structures.

11. The transistor arrangement of claim 10,
wherein the sense transistor is configured to program the charge storing structures using a source side injection mechanism.

12. The transistor arrangement of claim 1,
wherein the switch transistor further comprises a select structure;
wherein the select structure and the control structure of the switch transistor may be electrically controlled independently from one another.

13. The transistor arrangement of claim 12,
wherein the select structure of the switch transistor comprises a select gate that is configured as a spacer disposed over a sidewall of at least one of the charge storing structure and the control structure of the switch transistor.

14. The transistor arrangement of claim 1,
configured as a field programmable gate array cell.

15. An integrated circuit, comprising:
a plurality of field programmable gate array cells electrically connected to one another, wherein each field programmable gate array cell of the plurality of field programmable gate array cells comprises:
a transistor arrangement, comprising:
a switch transistor comprising a charge storing structure and a control structure; and
a sense transistor comprising a charge storing structure, a control structure and a select structure;
wherein the control structure of the switch transistor and the control structure of the sense transistor each comprise a control gate;
wherein the select structure of the sense transistor comprises a select gate;
wherein the charge storing structure of the switch transistor is electrically connected to the charge storing structure of the sense transistor; and
wherein the sense transistor is configured such that the select structure and the control structure of the sense transistor may be electrically controlled independently from one another.

16. The integrated circuit of claim 15,
configured as a programmable logic circuit.

17. A transistor arrangement, comprising:
a 1-transistor type switch device comprising a floating gate and a control gate; and
a 2-transistor type sense device comprising a floating gate, a control gate and a select gate;
wherein the floating gate of the switch device is electrically connected to the floating gate of the sense device; and
wherein the sense device is configured such that the select gate and the control gate of the sense device may be controlled independently from one another.

18. The transistor arrangement of claim 17,
wherein the select gate of the sense device is configured as a spacer that is disposed over a sidewall of at least one of the floating gate and the control gate of the sense device.

19. The transistor arrangement of claim 17,
wherein at least one of the gates of the switch device and the sense device comprises polysilicon.

20. The transistor arrangement of claim 17,
wherein the floating gate of the switch device and the floating gate of the sense device are part of a common floating gate; and
wherein the control gate of the switch device and the control gate of the sense device are part of a common control gate.

21. The transistor arrangement of claim 17,
wherein the sense device is configured to program the floating gates using a source side injection mechanism.

22. The transistor arrangement of claim 17,
configured as a field programmable gate array cell.

23. An integrated circuit, comprising:
a plurality of field programmable gate array cells electrically connected to one another, wherein each field programmable gate array cell of the plurality of field programmable gate array cells comprises:
a transistor arrangement, comprising:
a 1-transistor type switch device comprising a floating gate and a control gate; and
a 2-transistor type sense device comprising a floating gate, a control gate and a select gate;
wherein the floating gate of the switch device is electrically connected to the floating gate of the sense device; and
wherein the sense device is configured such that the select gate and the control gate of the sense device may be controlled independently from one another.

24. Integrated circuit of claim 23,
configured as a programmable logic circuit.

* * * * *